(12) United States Patent
Zivanovic

(10) Patent No.: US 6,670,836 B1
(45) Date of Patent: Dec. 30, 2003

(54) DIFFERENTIAL BUFFER HAVING BIAS CURRENT GATED BY ASSOCIATED SIGNAL

(75) Inventor: Branimir Zivanovic, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/223,257

(22) Filed: Aug. 15, 2002

(51) Int. Cl.[7] .................................................. H03B 3/00
(52) U.S. Cl. ........................................ 327/170; 327/108
(58) Field of Search ................................. 327/170, 544, 327/108, 77, 437; 365/233; 326/27, 71

(56) References Cited

U.S. PATENT DOCUMENTS

| | | | | |
|---|---|---|---|---|
| 4,818,901 A | * | 4/1989 | Young et al. | 326/27 |
| 5,440,248 A | | 8/1995 | Brown et al. | 326/71 |
| 5,546,016 A | * | 8/1996 | Allen | 327/310 |
| 5,838,630 A | * | 11/1998 | Okajima | 365/233 |
| 5,955,893 A | * | 9/1999 | Chang et al. | 326/71 |

* cited by examiner

*Primary Examiner*—Dinh T. Le
(74) *Attorney, Agent, or Firm*—Fish & Neave; Jeffrey H. Ingerman

(57) ABSTRACT

A differential buffer has a bias current that is gated by a signal associated with the buffer, such as its input or output. In a preferred embodiment, the bias current is low when the input is in a steady state, but increases as the input switches, to provide high bias current for faster switching of the output. The input preferably is monitored by a rising edge detector and a falling edge detector to turn on the high bias current as the input switches. The output preferably is also monitored, to turn off the high bias current after the output has finished switching, and a steady state has resumed.

21 Claims, 6 Drawing Sheets

DIFFERENTIAL BUFFER HAVING BIAS CURRENT GATED BY ASSOCIATED SIGNAL

BACKGROUND OF THE INVENTION

This invention relates to differential input buffers having reduced power consumption. More particularly, this invention relates to a differential buffer whose bias current is gated by one of its associated signals—i.e., by one of its inputs or outputs.

Differential buffers are well known. Like conventional buffers, they can increase the drive current for a signal, allowing it to be transmitted a longer distance, without amplification—i.e., without changing its voltage waveform. The exception is that the signal ordinarily is inverted. The difference between a differential buffer and a conventional buffer is that in addition to the signal input, a differential buffer has a reference input. The output of the differential buffer, then, effectively is a reflection of the input signal about the reference voltage, rather than about ground. In other words, as the input signal goes high, the output signal goes low when the voltage of the input signal exceeds the reference voltage, rather than when the voltage of the input signal becomes positive. Similarly, as the input signal goes low, the output signal goes high when the voltage of the input signal goes below the reference voltage, rather than when the input signal becomes negative. These relationships hold whether the reference voltage is positive or negative.

A differential buffer requires a bias current, particularly to enable fast switching when the buffer output switches, to reduce propagation delays. However, most of the time, the output of a differential buffer is not switching, but remains in a steady state. Therefore, if a high enough bias current is provided all the time to enable fast switching when necessary, the differential buffer consumes additional power unnecessarily during steady state operation.

It would be desirable to be able to provide a differential buffer having reduced steady-state power consumption while maintaining fast switching times.

SUMMARY OF THE INVENTION

In a differential buffer according to the present invention, the bias current is gated by one or both of the input and output signals. Steady-state power consumption is reduced by keeping the bias current low except during switching of the input and/or output waveforms. In a preferred embodiment, a rising edge detector and a falling edge detector monitor both the input and output waveforms. As the input begins to change (either to rise from a low level or to fall from a high level), the bias current is increased until it is detected that the output has changed (either has risen from a low level or has fallen from a high level).

Thus, in accordance with the present invention, there is provided a differential buffer having a reference input to which a reference signal is applied, a signal input to which an input signal is applied, a signal output on which an output signal is provided as a function of the input signal relative to the reference signal, and a bias current input to which a bias current is applied. The buffer includes biasing circuitry having at least one bias control input, bias current generating circuitry that generates a bias current as a function of the at least one bias control input, and a bias current output on which the bias current is provided. The bias current output of the biasing circuitry is connected to the bias current input of the differential buffer; wherein one of the at least one bias control input is one of (a) the signal input, and (b) the signal output.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
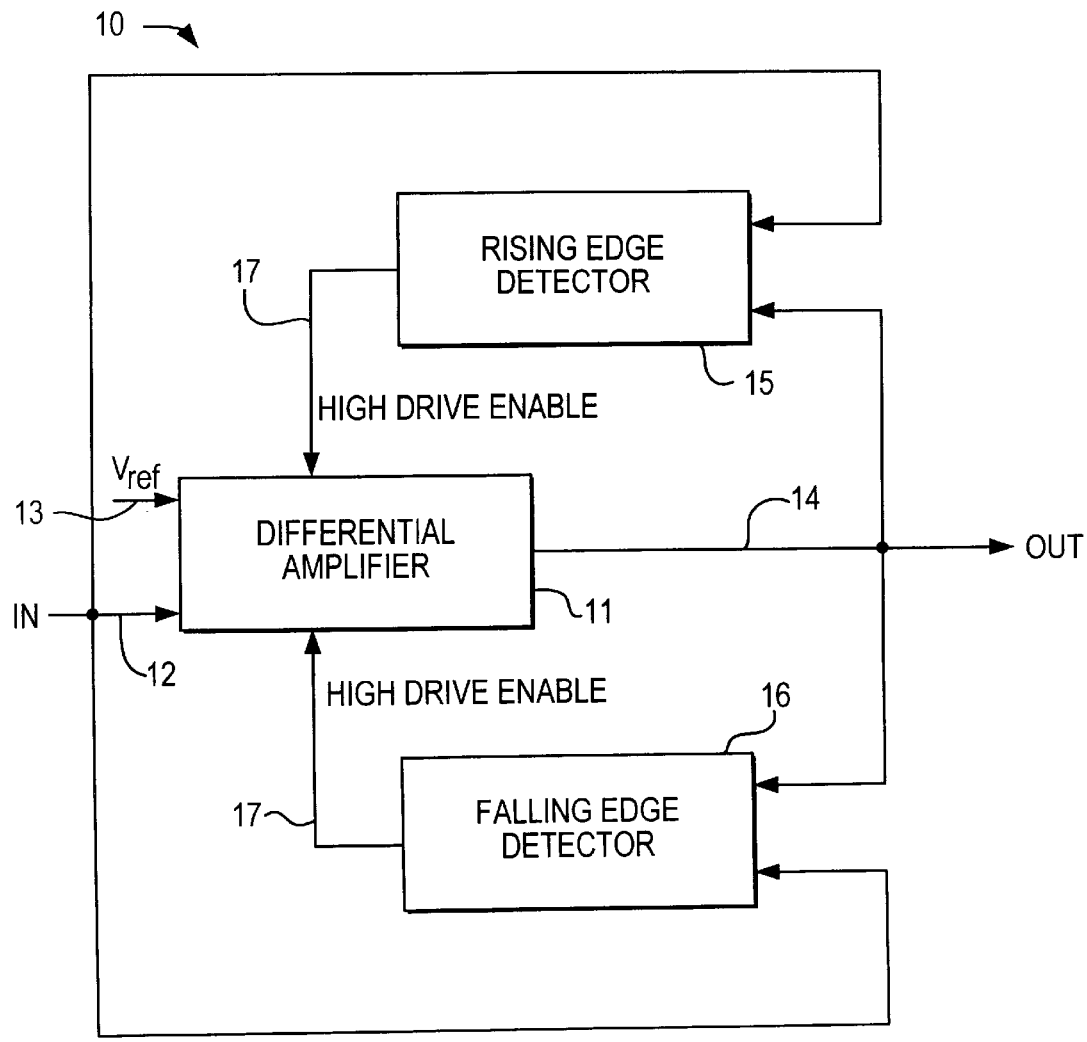
FIG. 1 is a block diagram of a preferred embodiment of a differential buffer in accordance with the present invention.

The present invention provides a differential buffer whose switching point tracks a reference voltage in both switching and non-switching modes of operation, while providing lower power consumption during the non-switching mode of operation when high bias current is not needed to enable fast switching. The differential buffer of the invention can be used, e.g., as an input buffer for any device that requires a buffer with an adjustable switching point, and that has, or can be made to have, a high drive. One such device, with which the present invention can be used as a differential input buffer, is SDRAM, and particularly, Double Data Rate SDRAM. However, it also can be used with any device where a reference signal, such as a reference voltage, is to be allowed to set the switching point.

In accordance with the invention, the differential buffer adjusts its own bias current based preferably on the condition of input waveform, and also preferably on the response of the output waveform. If the input signal is at a steady state, the bias current preferably is at a low, power-conserving level. If the input signal starts to switch, the bias current preferably will increase to allow fast switching of the output, until the output also switches, at which point the bias current preferably decreases to its previous low level.

Thus, the bias current may be said to be gated by both the input and output signals. It is also possible for the bias current to be gated only by the input signal, so that the bias current increases when the input signal changes, but some other trigger, such as the input signal remaining in its new state for a predetermined time period, would be needed to return the bias current to its lower level. Similarly, if a fast enough gating circuit can be provided, the bias current can be gated only by the output signal, so that as soon as the output begins to switch, the bias current is increased to allow rapid completion of that switching, and after the output has remained in its new state for a predetermined time period, the bias current can be returned to its lower level. In a particularly preferred embodiment, however, the bias current is gated by both the input signal and the output signal.

In a particularly preferred embodiment, the biasing circuitry includes a rising edge detector and a falling edge detector monitoring both the input signal and the output signal. If the input signal is in a steady state low condition and starts to rise, the rising edge detector will sense that switching of the input signal and will turn on a higher level of bias current to allow faster switching of the output signal. When the output signal switches, that will be detected by either the rising edge detector or the falling edge detector, depending on the initial state of the output signal. and will return the bias current to its lower steady-state level. Similarly, if the input signal is in a steady state high condition and starts to fall, the falling edge detector will sense that switching of the input signal and will turn on a higher level of bias current to allow faster switching of the output signal. When the output signal switches, that will be detected by either the rising edge detector or the falling edge detector, depending on the initial state of the output signal. and will return the bias current to its lower steady-state level.

The invention will now be described with reference to FIGS. 1–6.

A simplified block diagram of a preferred embodiment of a differential buffer 10 according to the present invention is shown in FIG. 1. As seen, differential buffer 10 includes a differential amplifier circuit 11 having a signal input 12 and a reference input 13, as well as a signal output 14. Differential buffer 10 further includes a rising edge detector 15 that monitors both input 12 and output 14, and a falling edge detector 16 that monitors both input 12 and output 14. Both rising edge detector 15 and falling edge detector 16 are capable of generating a high-drive enable signal 17 that is input to amplifier circuit 11 to turn on the aforementioned high bias current.

In a steady state, input signal 12 is in a steady high or low state relative to reference input 13, and output 14 is also either high or low. Because nothing is switching, there is no high-drive enable signal 17 being generated by either rising edge detector 15 or falling edge detector 16, and the bias current of amplifier circuit 11 is low, so that power consumption is low.

As input signal 12 starts to transition, it will have either a rising or falling edge (depending on its initial state), which will be detected by either rising edge detector 15 or falling edge detector 16, one of which will generate a high-drive enable signal 17. The bias current of amplifier circuit 11 will increase, enabling fast switching of output signal 14. When output signal 14 begins to transition, the rising or falling edge (depending on the initial state of output signal 14) will be detected by rising edge detector 15 or falling edge detector 16, which will turn off high-drive enable signal 17. The bias current of amplifier circuit 11 will return to its low value, as will its power consumption.

Figure 2:
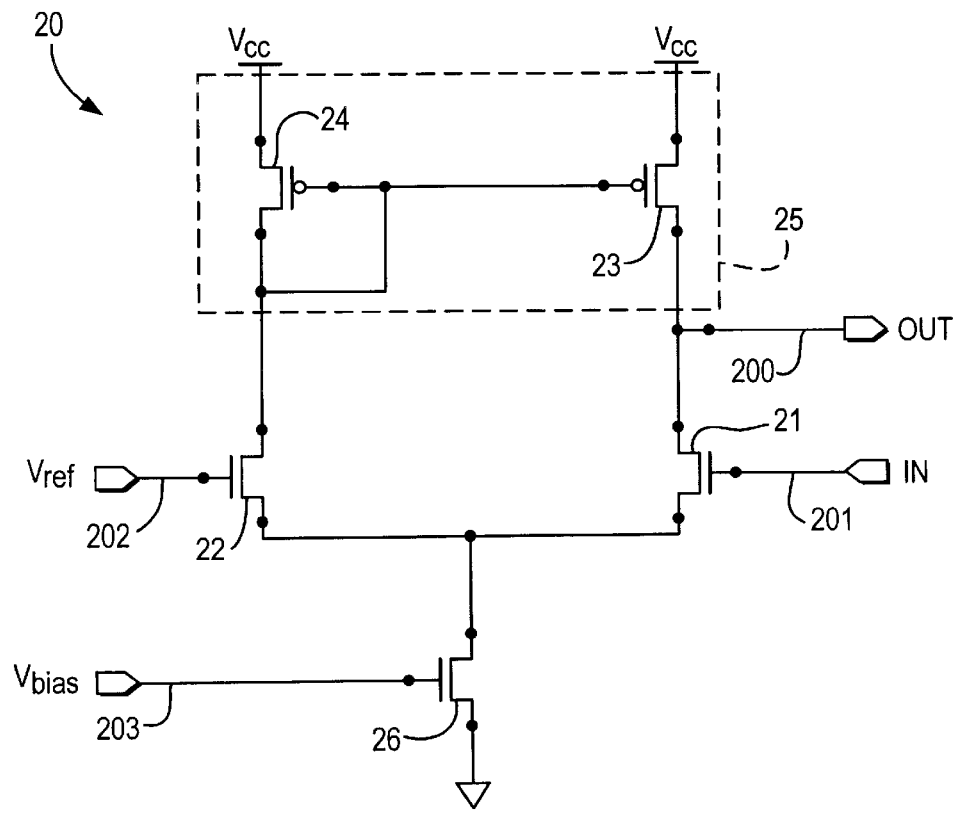
FIG. 2 is a schematic representation of a previously known differential buffer circuit.
Figure 3:
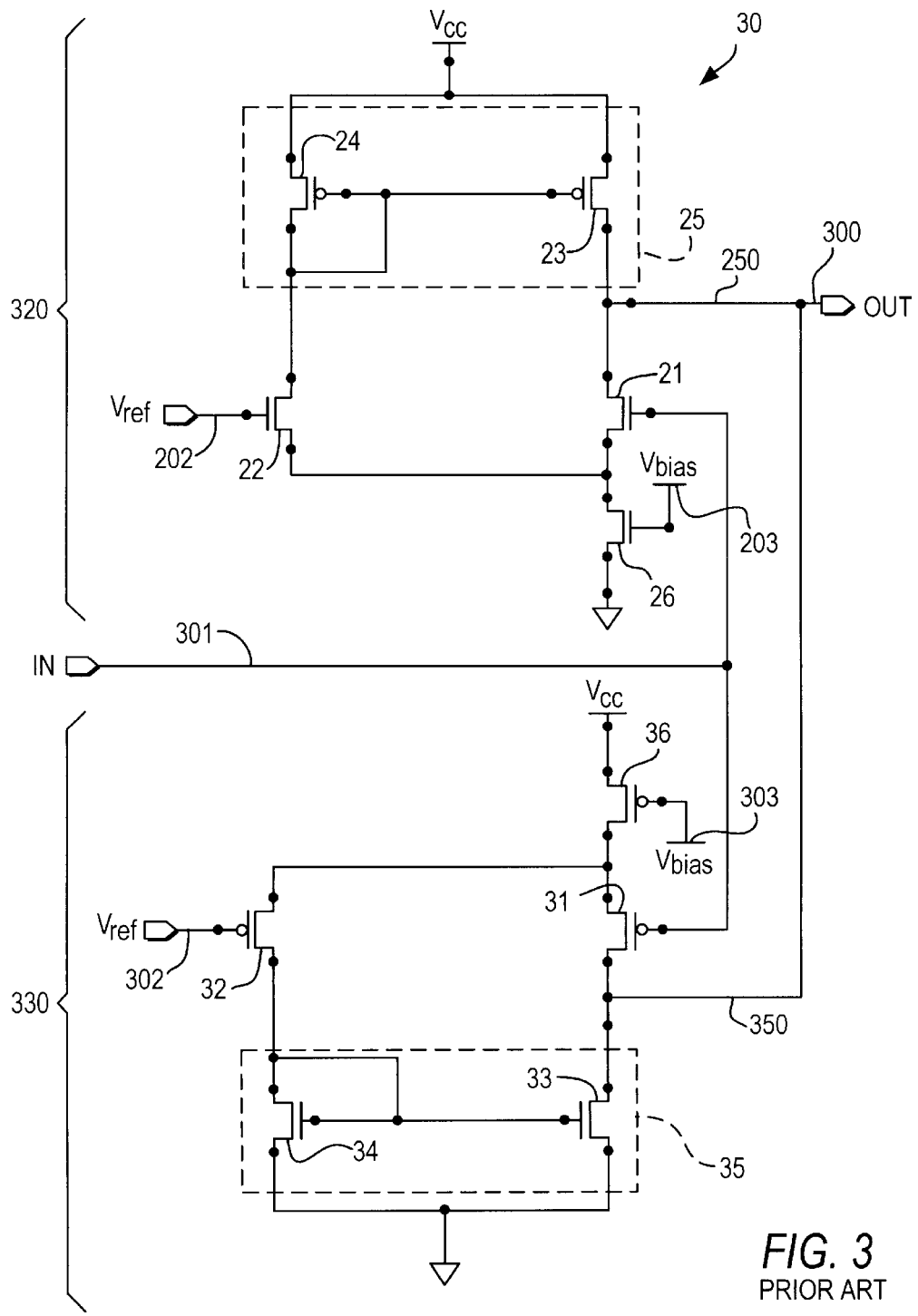
FIG. 3 is a schematic representation of another previously known differential buffer circuit.

To understand a particular circuit implementation of differential buffer 10 (see FIG. 4), it is useful first to describe standard differential input buffers 20, 30, seen in FIGS. 2 and 3, respectively.

A simple previously known NMOS differential input buffer 20 is shown in FIG. 2, including input transistor 21 and reference transistor 22 connected source-to-source, with the respective drains of transistors 21 and 22 connected to respective PMOS transistors 23 and 24 which are connected as a current mirror 25. Bias current transistor 26 is connected between ground and the common sources of transistors 21 and 22. Output 200 of input buffer 20 is taken from the junction of transistors 21 and 23.

It can be seen that if the input 201 goes high, transistor 21 will be turned on, and output 200 will be pulled low, toward ground, while if input 201 goes low, transistor 21 will be turned off, and output 200 will be pulled high. As is well known, reference transistor 22 causes reference input voltage 202 to control the voltage value at input 201 that is needed to cause a transition of output 200. As is also well known, bias control voltage 203 determines how much bias current is provided by transistor 26. The higher the bias current, the faster output 200 will switch after a transition of input 201.

A somewhat more complex previously known differential input buffer 30 is shown in FIG. 3. Input buffer 30 has an NMOS stage 320 that is substantially similar to input buffer 20 of FIG. 2, coupled to a PMOS stage 330. The components of NMOS stage 320 are labelled identically to those of input buffer 20, with the exception of output 250 which nevertheless acts like output 200. PMOS stage 330 includes input transistor 31 and reference transistor 32 connected source-to-source, with the respective drains of transistors 31 and 32 connected to respective NMOS transistors 33 and 34 which are connected as a current mirror 35. Bias current transistor 36 is connected between the supply voltage and the common sources of transistors 31 and 32. Output 350, taken from the junction of transistors 31 and 33, is tied to output 250, and together they constitute output 300.

It can be seen that if the input 301, which is tied to input 201, goes high, transistor 31 will be turned off, and output 350 will be pulled low, toward ground, while if input 301 goes low, transistor 31 will be turned on, and output 350 will be pulled high. Thus, output 350 reacts the same way as output 250, as is required, insofar as the outputs are tied together as output 300. Again, as is well known, reference transistor 32 causes reference input voltage 302 (normally identical to reference input voltage 202) to control the voltage value at input 301 that is needed to cause a transition of output 350. As is also well known, bias control voltage 303 (normally identical to bias control voltage 203) determines how much bias current is provided by transistor 36. The higher the bias current, the faster output 350 will switch after a transition of input 301.

The advantage of input buffer 30 over input buffer 20 is that the output of buffer 30 can swing full-rail, whereas the output of buffer 20 can never reach ground because of the presence of bias current transistor 26. Therefore, the output of buffer 30 is more symmetrical about the reference voltage.

Figure 4:
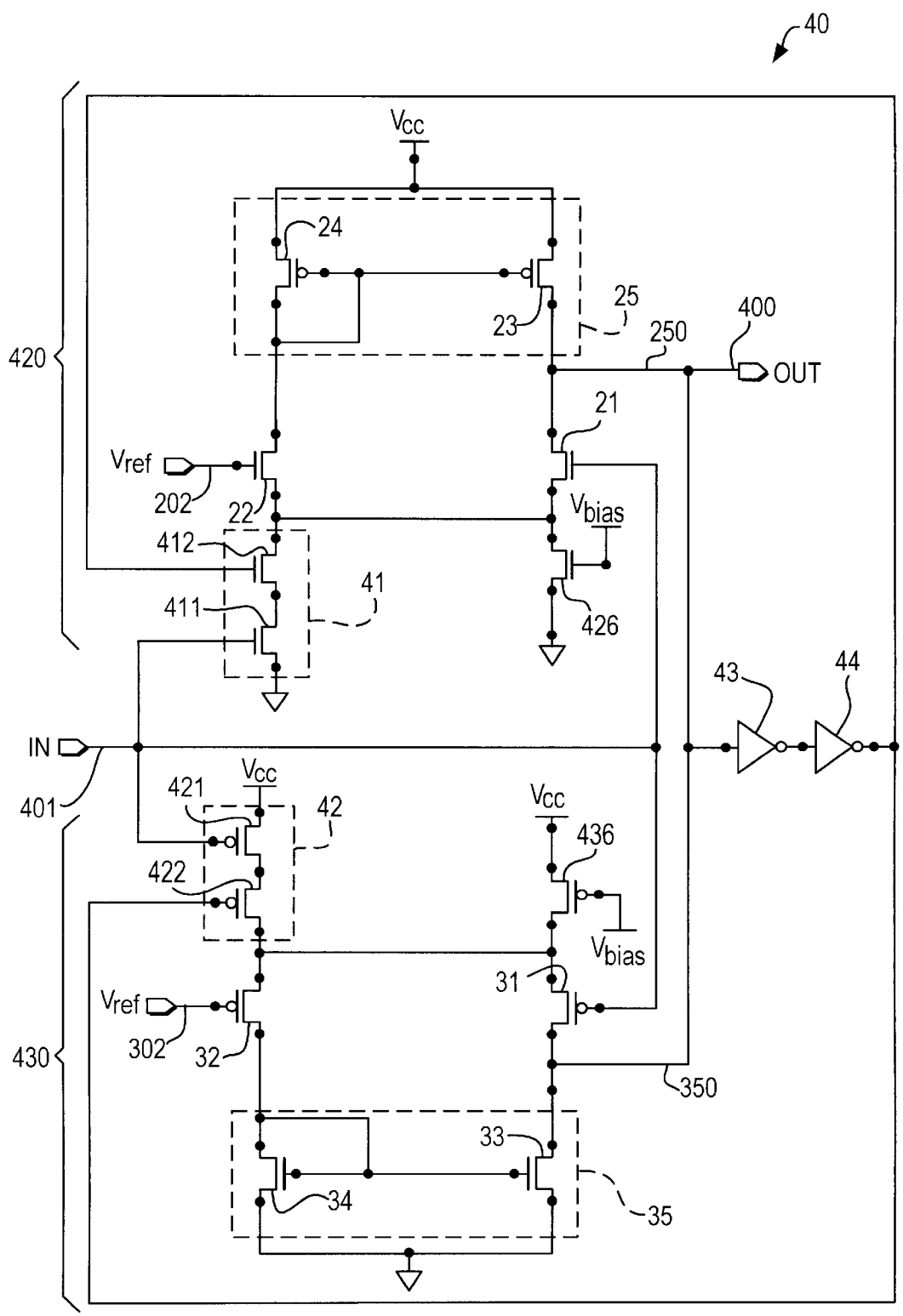
FIG. 4 is a schematic representation of the differential buffer of FIG. 1.

As can be seen in FIG. 4, a preferred circuit implementation of a differential input buffer 40 in accordance with the present invention is similar to buffer 30 of FIG. 3. The main differences are that bias transistors 426 and 436 are controlled by a fixed bias voltage to provide a steady minimum bias current for the steady-state condition, while rising edge detector/high bias current source 41 and falling edge detector/high bias current source 42 control the supply of high bias current during switching.

Thus, if in the steady state, input signal 401 is low and output signal 400 is high, then transistors 411 and 422 will be off and the only bias current will be the low current provided by transistors 426, 436. If input signal 401 starts to go high, transistor 411 will turn on, and transistor 412 will already be on because of the high output 400. Therefore, rising edge detector/high bias current source 41 will provide high bias current to allow fast switching of NMOS stage 420. Although PMOS stage falling edge detector/high bias current source 42 will not turn on to provide high bias current to PMOS stage 430, buffer 40 will nevertheless switch quickly because of NMOS stage 420. Once output 400 has switched and gone low, transistor 412 will turn off, turning of the high bias current. To prevent rising edge detector/high bias current source 41 from turning of too soon as output 400 begins switching, but before it finishes switching, inverters 43, 44 are provided to delay feedback of output 400 to transistor 412.

Similarly, if in the steady state, input signal 401 is high and output signal 400 is low, then transistors 421 and 412 will be off and the only bias current will be the low current provided by transistors 426, 436. If input signal 401 starts to go low, transistor 421 will turn on, and transistor 422 will already be on because of the low output 400. Therefore, falling edge detector/high bias current source 42 will provide high bias current to allow fast switching of PMOS stage 430. Although NMOS stage rising edge detector/high bias current source 41 will not turn on to provide high bias current to NMOS stage 420, buffer 40 will nevertheless switch quickly because of PMOS stage 430. Once output 400 has switched and gone high, transistor 422 will turn off, turning of the high bias current. To prevent falling edge detector/high bias current source 42 from turning of too soon as output 400 begins switching, but before it finishes switching, inverters 43, 44 are provided to delay feedback of output 400 to transistor 422.

It should noted that while transistors 411, 412 have been described as forming rising edge detector/high bias current source 41, while transistors 421, 422 have been described as forming falling edge detector/high bias current source 42, transistors 411, 421 can be thought of together as an input edge detector, while transistors 412, 422 can be thought of together as an output edge detector.

Figure 5:
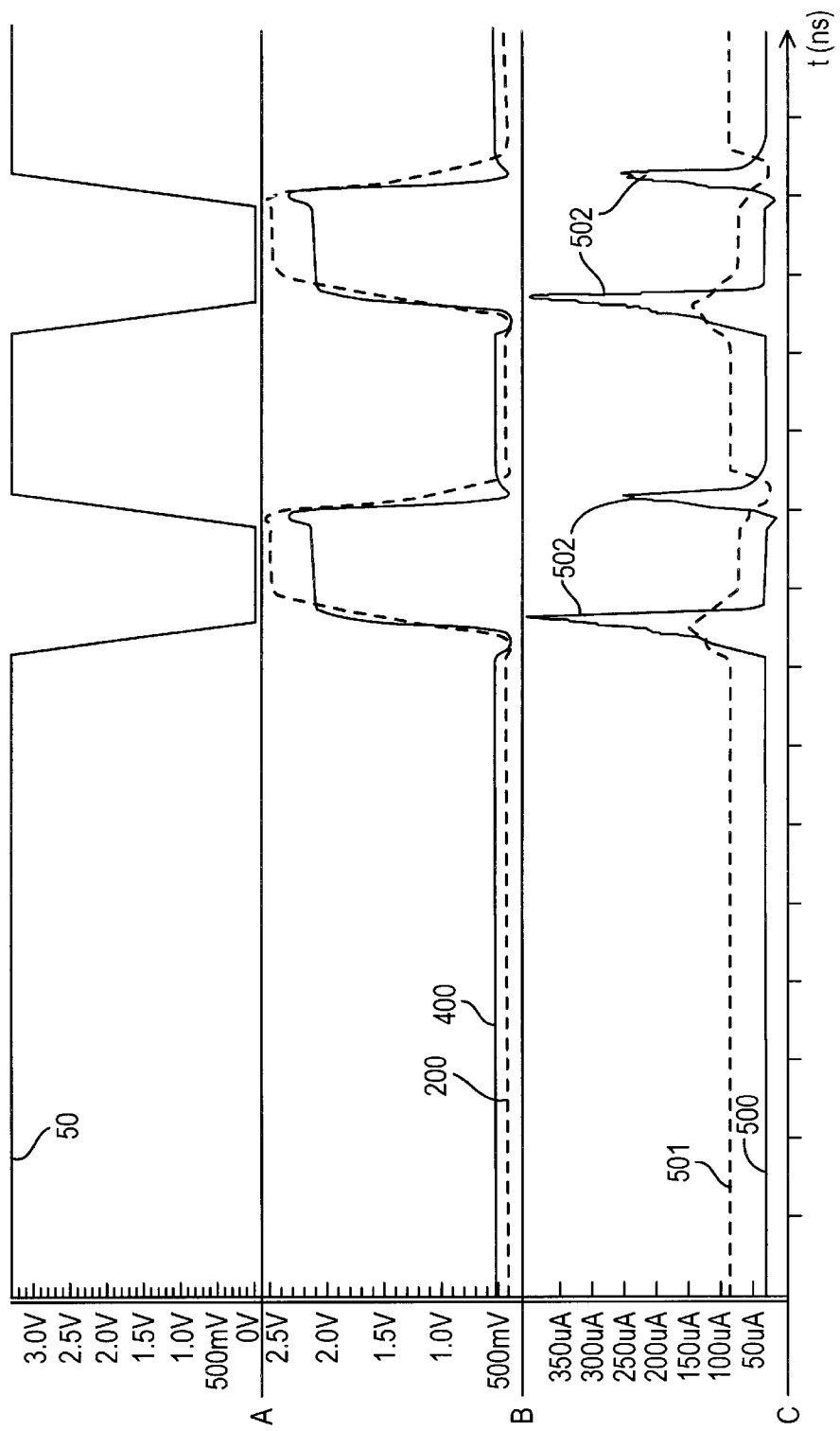
FIG. 5 includes waveforms comparing the input and output signals, and the current consumption, of the circuit of FIGS. 1 and 4 and the circuit of FIG. 2.

FIG. 5 shows a comparison of the performance of buffer 40 to that of buffer 20. Waveform A is the input signal 50, which is common to both buffers 20, 40, and is normally high in this example. Plot B shows the normally low output signals 200, 400. As can be seen, both signals 200, 400 go high when input signal 50 goes low. However, signal 400 climbs slightly faster than signal 200, as a result of the higher bias current. At the same time, as seen in plot C, current consumption 500 (and therefore power consumption) of buffer 40 is lower in the steady state than current consumption 501 (and therefore power consumption) of buffer 20. And even though current consumption 500 of buffer 40 increases dramatically during switching events 502, when the high bias current is turned on, average power consumption of buffer 40 is still lower than that of buffer 20 in the example shown.

Figure 6:
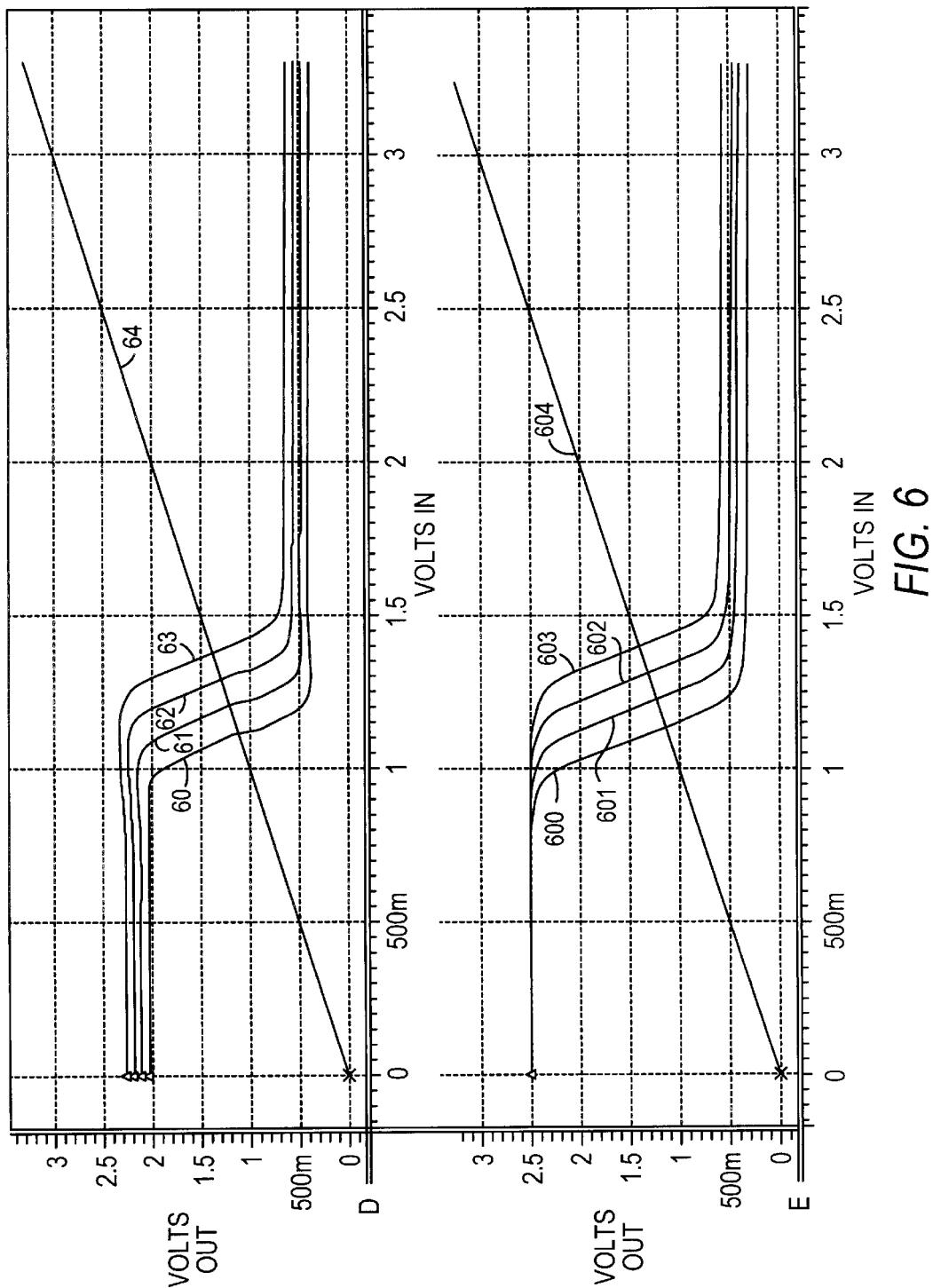
FIG. 6 includes waveforms comparing the switching of the circuit of FIGS. 1 and 4, as a function of reference voltage, to the switching of the circuit of FIG. 2.

FIG. 6 shows a comparison of the switching characteristics of buffer 40 to that of buffer 20. Plot D shows the output profiles 60, 61, 62, 63 of buffer 40 for reference voltages 1.1V, 1.2V, 1.3V and 1.4V, respectively, as the input voltage increases from 0V to 3.3V. Similarly, plot E shows the output profiles 600, 601, 602, 603 of buffer 20 for reference voltages 1.1V, 1.2V, 1.3V and 1.4V, respectively, as the input voltage increases from 0V to 3.3V. The switching points, which can be read on plots D and E as the intersections of the respective voltage profiles with respective lines 64, 604 representing the steady increase in input voltage from 0V to 3.3V, are as follows:

| Reference Voltage (volts) | Buffer 40 Switching Point (volts) | Buffer 20 Switching Point (volts) |
| --- | --- | --- |
| 1.10 | 1.12 | 1.13 |
| 1.20 | 1.21 | 1.23 |
| 1.30 | 1.30 | 1.31 |
| 1.40 | 1.38 | 1.40 |

As can be seen, the switching points of buffer 40 are essentially the same as those of buffer 20. Thus, the switching characteristics of buffer 40 are substantially the same as those of buffer 20 while the power consumption of buffer 40 is substantially lower than the power consumption of buffer 20.

Thus it is seen that a differential buffer having reduced steady-state power consumption while maintaining fast switching times is provided. One skilled in the art will appreciate that the present invention can be practiced by other than the described embodiments, which are presented for purposes of illustration and not of limitation, and the present invention is limited only by the claims which follow.

What is claimed is:

1. A differential buffer comprising:
   a reference input to which a reference signal is applied;
   a signal input to which an input signal is applied;
   a signal output on which an output signal is provided as a function of said input signal relative to said reference signal;
   a bias current input to which a bias current is applied; and
   biasing circuitry having:
   at least one bias control input,
   bias current generating circuitry that generates a bias current as a function of said at least one bias control input, and
   a bias current output on which said bias current is provided, said bias current output being connected to said bias current input; wherein:
   said at least one bias control input comprises a first bias control input connected to said signal input.

2. The differential buffer of claim 1 wherein said at least one bias control input further comprises a second bias control input connected to said signal output.

3. The differential buffer of claim 1 wherein said biasing circuitry provides said bias current at a first value under a steady-state operating condition and at a second value higher than said first value when a signal received at said at least one bias control input signifies that said signal output is about to switch.

4. The differential buffer of claim 3 wherein said biasing circuitry decreases said bias current from said second value to said first value after said signal output has switched.

5. The differential buffer of claim 4 wherein:
   said biasing circuitry comprises an input edge detector that detects one of (a) a rising edge of voltage on said signal input, and (b) a falling edge of voltage on said signal input; and
   said biasing circuitry increases said bias current from said first value to said second value on detection of one of (a) said rising edge of voltage on said signal input, and (b) said falling edge of voltage on said signal input.

6. The differential buffer of claim 5 wherein:
   said biasing circuitry comprises an output edge detector that detects one of (a) a rising edge of voltage on said signal output, and (b) a falling edge of voltage on said signal output; and
   said biasing circuitry decreases said bias current from said second value to said first value on detection of one of (a) said rising edge of voltage on said signal output, and (b) said falling edge of voltage on said signal output.

7. The differential buffer of claim 4 wherein:
   said biasing circuitry comprises a rising edge detector that detects one of (a) a rising edge of voltage on said signal input, and (b) a rising edge of voltage on said signal output; and
   said biasing circuitry changes said bias current from one of said first and second values to another of said first and second values on detection of one of (a) said rising edge of voltage on said signal input, and (b) said rising edge of voltage on said signal output.

8. The differential buffer of claim 7 wherein:

said biasing circuitry comprises a falling edge detector that detects one of (a) a falling edge of voltage on said signal input, and (b) a falling edge of voltage on said signal output; and said biasing circuitry changes said bias current from one of said first and second values to another of said first and second values on detection of one of (a) said falling edge of voltage on said signal input, and (b) said falling edge of voltage on said signal output.

9. The differential buffer of claim 4 wherein:

said biasing circuitry comprises a falling edge detector that detects one of (a) a falling edge of voltage on said signal input, and (b) a falling edge of voltage on said signal output; and said biasing circuitry changes said bias current from one of said first and second values to another of said first and second values on detection of one of (a) said falling edge of voltage on said signal input, and (b) said falling edge of voltage on said signal output.

10. The differential buffer of claim 3 wherein:

said biasing circuitry comprises a rising edge detector that detects at least one of (a) a rising edge of voltage on said signal input, and (b) a rising edge of voltage on said signal output; and said biasing circuitry changes said bias current from said first value to said second value on detection of one of (a) said rising edge of voltage on said signal input, and (b) said rising edge of voltage on said signal output.

11. The differential buffer of claim 3 wherein:

said biasing circuitry comprises a falling edge detector that detects one of (a) a falling edge of voltage on said signal input, and (b) a falling edge of voltage on said signal output; and said biasing circuitry changes said bias current from said first value to said second value on detection of one of (a) said falling edge of voltage on said signal input, and (b) said falling edge of voltage on said signal output.

12. The differential buffer of claim 3 wherein:

said biasing circuitry comprises an input edge detector that detects one of (a) a rising edge of voltage on said signal input, and (b) a falling edge of voltage on said signal input; and said biasing circuitry increases said bias current from said first value to said second value on detection of one of (a) said rising edge of voltage on said signal input, and (b) said falling edge of voltage on said signal input.

13. A differential buffer comprising:

a reference input to which a reference signal is applied;

a signal input to which an input signal is applied;

a signal output on which an output signal is provided as a function of said input signal relative to said reference signal;

a bias current input to which a bias current is applied; and biasing circuitry having:
 at least one bias control input,
 bias current generating circuitry that generates a bias current as a function of said at least one bias control input, and
 a bias current output on which said bias current is provided, said bias current output being connected to said bias current input; wherein:
  one of said at least one bias control input is connected to one of (a) said signal input, and (b) said signal output;
  said biasing circuitry provides said bias current at a first value under a steady-state operating condition and at a second value higher than said first value when a signal received at said at least one bias control input signifies that said signal output is about to switch;
  said biasing circuitry further comprises an output edge detector that detects one of (a) a rising edge of voltage on said signal output, and (b) a falling edge of voltage on said signal output; and
  said biasing circuitry decreases said bias current from said second value to said first value after said signal output has switched, on detection of one of (a) said rising edge of voltage on said signal output, and (b) said falling edge of voltage on said signal output.

14. A differential buffer comprising:

a reference input to which a reference signal is applied;

a signal input to which an input signal is applied;

a signal output on which an output signal is provided as a function of said input signal relative to said reference signal;

a bias current input to which a bias current is applied; and biasing circuitry having:
 at least one bias control input,
 bias current generating circuitry that generates a bias current as a function of said at least one bias control input, and
 a bias current output on which said bias current is provided, said bias current output being connected to said bias current input; wherein:
  one of said at least one bias control input is connected to one of (a) said signal input, and (b) said signal output;
  said biasing circuitry provides said bias current at a first value under a steady-state operating condition and at a second value higher than said first value when a signal received at said at least one bias control input signifies that said signal output is about to switch;
  said biasing circuitry further comprises an output edge detector that detects one of (a) a rising edge of voltage on said signal output, and (b) a falling edge of voltage on said signal output; and
  said biasing circuitry increases said bias current from said first value to said second value on detection of one of (a) said rising edge of voltage on said signal output, and (b) said falling edge of voltage on said signal output.

15. A differential buffer comprising:

reference input means to which a reference signal is applied;

signal input means to which an input signal is applied;

signal output means on which an output signal is provided as a function of said input signal relative to said reference signal;

bias current input means to which a bias current is applied; and biasing means having:
 at least one bias control input means,
 bias current generating means for generating a bias current as a function of said at least one bias control input means, and bias current output means on which said bias current is provided, said bias current output means being connected to said bias current input means; wherein:
said at least one bias control input means comprises a first bias control input means connected to said signal input means.

16. A differential buffer comprising:

a buffer circuit having a signal input, a reference input and a signal output, wherein voltage on said signal output is high when voltage on said signal input is less than voltage on said reference input and is low when voltage on said signal input exceeds voltage on said reference input; and a drive current circuit providing drive current of a first magnitude, and providing drive current of a second magnitude greater than said first magnitude responsive to a high-drive enable signal, said drive current circuit comprising:

a falling edge detector monitoring said signal input and said signal output and generating said high-drive enable signal when said voltage on said signal input falls and said voltage on said signal output is low, such that said voltage on said signal output is about to switch high; and a rising edge detector monitoring said signal input and said signal output and generating said high-drive enable signal when said voltage on said signal input rises and said voltage on said signal output is high, such that said voltage on said signal output is about to switch low; whereby:

said drive current is of said first magnitude except when said voltage on said signal output is about to switch, at which time said drive current is of said second magnitude.

17. The differential buffer of claim 16 wherein:

said falling edge detector comprises first and second NMOS transistors in series between said buffer circuit and ground;

said first NMOS transistor is gated by said voltage on said signal input; and said second NMOS transistor is gated by said voltage on said signal output.

18. The differential buffer of claim 17 wherein:

said rising edge detector comprises first and second PMOS transistors in series between said buffer circuit and a supply of positive voltage;

said first PMOS transistor is gated by said voltage on said signal input; and said second PMOS transistor is gated by said voltage on said signal output.

19. The differential buffer of claim 16 wherein:

said rising edge detector comprises first and second PMOS transistors in series between said buffer circuit and a supply of positive voltage;

said first PMOS transistor is gated by said voltage on said signal input; and said second PMOS transistor is gated by said voltage on said signal output.

20. The differential buffer of claim 16 further comprising a delay circuit between said signal output and each of said rising edge detector and said falling edge detector.

21. A differential buffer comprising:

buffer means having signal input means, reference input means and signal output means, wherein voltage on said signal output means is high when voltage on said signal input means is less than voltage on said reference input means and is low when voltage on said signal input means exceeds voltage on said reference input means; and drive current means for providing drive current of a first magnitude, and providing drive current of a second magnitude greater than said first magnitude responsive to a high-drive enable signal, said drive current means comprising:

falling edge detector means monitoring said signal input means and said signal output means for generating said high-drive enable signal when said voltage on said signal input means falls and said voltage on said signal output means is low, such that said voltage on said signal output means is about to switch high; and rising edge detector means monitoring said signal input means and said signal output means and generating said high-drive enable signal when said voltage on said signal input means rises and said voltage on said signal output means is high, such that said voltage on said signal output means is about to switch low; whereby:

said drive current is of said first magnitude except when said voltage on said signal output means is about to switch, at which time said drive current is of said second magnitude.

* * * * *